United States Patent
Cheng et al.

(10) Patent No.: US 9,927,506 B2
(45) Date of Patent: Mar. 27, 2018

(54) TRANSMIT ANTENNA SELECTOR AND MAGNETIC RESONANCE IMAGING SYSTEM

(71) Applicants: Hong Cheng, Shenzhen (CN); Stefan Pott, Nürnberg (DE); JianMin Wang, Shenzhen (CN); Lan Wang, Shenzhen (CN)

(72) Inventors: Hong Cheng, Shenzhen (CN); Stefan Pott, Nürnberg (DE); JianMin Wang, Shenzhen (CN); Lan Wang, Shenzhen (CN)

(73) Assignee: Siemens Aktiengesellschaft, München (DE)

( * ) Notice: Subject to any disclaimer, the term of this patent is extended or adjusted under 35 U.S.C. 154(b) by 860 days.

(21) Appl. No.: 14/151,566

(22) Filed: Jan. 9, 2014

(65) Prior Publication Data

US 2014/0191758 A1    Jul. 10, 2014

(30) Foreign Application Priority Data

Jan. 10, 2013  (CN) .......................... 2013 1 0009092

(51) Int. Cl.
*G01V 3/00*  (2006.01)
*G01R 33/36*  (2006.01)

(52) U.S. Cl.
CPC ................ *G01R 33/3664* (2013.01)

(58) Field of Classification Search
CPC .................................. G01R 33/3664
USPC .................... 324/322; 333/17.3, 32
See application file for complete search history.

(56) References Cited

U.S. PATENT DOCUMENTS

| | | | | |
|---|---|---|---|---|
| 4,833,429 A | | 5/1989 | Keren et al. | |
| 5,243,287 A | * | 9/1993 | Hashoian | G01R 33/3657 324/322 |
| 5,317,266 A | * | 5/1994 | Meissner | G01R 33/341 324/322 |
| 5,903,151 A | * | 5/1999 | Potthast | G01R 33/3621 324/322 |
| 6,791,328 B1 | * | 9/2004 | Nabetani | G01R 33/34076 324/322 |
| 6,806,711 B2 | * | 10/2004 | Reykowski | G01R 33/34053 324/318 |
| 7,965,082 B2 | * | 6/2011 | Greim | G01R 33/34076 324/322 |

(Continued)

FOREIGN PATENT DOCUMENTS

| | | |
|---|---|---|
| CN | 1891151 A | 1/2007 |
| CN | 101488766 A | 7/2009 |

(Continued)

OTHER PUBLICATIONS

Oppelt, Imaging Systems for Medical Diagnostics, 2nd Edition, 2005, p. 572.*

(Continued)

*Primary Examiner* — Susan Lee
(74) *Attorney, Agent, or Firm* — Lempia Summerfield Katz LLC

(57) ABSTRACT

A transmit antenna selector includes a control circuit, a body coil signal output interface, a local coil signal output interface, a radio-frequency signal input interface, and a dummy load. The control circuit includes a plurality of diodes. The control circuit electrically connects, according to a control signal and via the plurality of diodes, the radio-frequency signal input interface with the body coil signal output interface, with the local coil signal output interface, or with the dummy load.

17 Claims, 1 Drawing Sheet

(56) References Cited

U.S. PATENT DOCUMENTS

| | | | |
|---|---|---|---|
| 9,146,288 B2* | 9/2015 | Xing | G01R 33/341 |
| 2005/0127914 A1* | 6/2005 | Eberler | G01R 33/3657 |
| | | | 324/322 |
| 2005/0156598 A1 | 7/2005 | Matschl et al. | |
| 2006/0033497 A1* | 2/2006 | Chmielewski | G01R 33/34046 |
| | | | 324/322 |
| 2008/0197848 A1* | 8/2008 | Zhai | G01R 33/3664 |
| | | | 324/318 |
| 2008/0284428 A1* | 11/2008 | Fiedler | G01R 33/28 |
| | | | 324/307 |
| 2009/0076377 A1* | 3/2009 | Findekelee | G01R 33/365 |
| | | | 600/422 |
| 2010/0052683 A1 | 3/2010 | Huber | |
| 2011/0316540 A1 | 12/2011 | Price | |
| 2013/0241556 A1* | 9/2013 | Bollenbeck | G01R 33/3415 |
| | | | 324/322 |

FOREIGN PATENT DOCUMENTS

| | | | |
|---|---|---|---|
| JP | 05091988 A | * | 4/1993 |
| JP | 2008296011 A | | 12/2008 |

OTHER PUBLICATIONS

Chinese office Action for related Chinese Application No. 201310009092.5 dated Mar. 11, 2016.
Korean Office Action for related Korean Application No. 10-2014-0003385, dated Jun. 22, 2015.

* cited by examiner

TRANSMIT ANTENNA SELECTOR AND MAGNETIC RESONANCE IMAGING SYSTEM

This application claims the benefit of CN 201310009092.5, filed on Jan. 10, 2013, which is hereby incorporated by reference in its entirety.

BACKGROUND

The present embodiments relate to magnetic resonance imaging and to a transmit antenna selector of a magnetic resonance imaging system.

Magnetic resonance imaging (MRI) is a technique using magnetic resonance phenomena for imaging. The principle of magnetic resonance phenomena involves a nucleus containing a single proton (e.g., the proton of a hydrogen nucleus) that is present throughout the human body. The nucleus has a spinning movement, like a small magnet. The spin axes of these small magnets do not have a certain arrangement. If an external magnetic field is applied, the small magnets are rearranged according to the magnetic force lines of the external magnetic field. The small magnets are arranged in two directions that are parallel or antiparallel to the magnetic force lines of the external magnetic field. The direction parallel to the magnetic force lines of the external magnetic field may be a positive longitudinal axis, and the direction antiparallel to the magnetic force lines of the external magnetic field is called a negative longitudinal axis. The nucleus has a longitudinal magnetization component, and the longitudinal magnetization component has both direction and amplitude. Nuclei in the external magnetic field are excited by a radio-frequency (RF) pulse with a specific frequency to make the spin axes of the nuclei deviate from the positive longitudinal axis or the negative longitudinal axis to produce resonance (i.e., the magnetic resonance phenomenon). After the spin axes of the excited nuclei deviate from the positive longitudinal axis or the negative longitudinal axis, the nuclei have a transverse magnetization component. After transmission of the RF pulses is stopped, the excited nuclei transmit echo signals to release the absorbed energy discretely in the form of electromagnetic waves, the phase and energy level of the nuclei both recovering to the state before being excited. An image may be reconstructed after the echo signals transmitted by the nuclei are subjected to further processing such as space encoding.

An MRI system may operate with a number of various RF antennas (which may be referred to as coils hereinafter). The RF antennas are used for transmitting and receiving RF pulses so as to excite nuclei to radiate magnetic resonance signals and/or for collecting induced magnetic resonance signals. The MRI system includes various coils, such as a body coil covering the whole body area, a receiving coil only covering some parts of the body, and so on. An MRI system may have a large integrated coil (e.g., a body coil) permanently fixed in a magnetic resonance scanner. The integrated coil may be arranged in a cylindrical manner surrounding a patient acquisition cavity (e.g., using a structure referred to as a birdcage structure). In the patient acquisition cavity, a patient is supported on a bed (e.g., a patient positioning table) during measurement.

A transmit antenna selector (TAS) is provided to switch and transmit radio-frequency signals to two output paths, a local coil and a body coil. Past transmit antenna selectors have used mechanical switches. The mechanical switches are controlled by direct current signals. Because the total number of output paths is two, the TAS uses two mechanical switches, leading to higher costs. In addition, the service life of the mechanical switch, depending on the number of on/off times, is relatively limited.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a transmit antenna selector may be provided to replace mechanical switches. The transmit antenna selector may be stable in performance, low in cost and suitable for long-term use.

The transmit antenna selector includes a control circuit, a body coil signal output interface, a local coil signal output interface, an RF signal input interface and a dummy load. The control circuit includes a plurality of diodes. The control circuit electrically connects the RF signal input interface with the body coil signal output interface, with the local coil signal output interface, or with the dummy load, in accordance with a control signal and via the diodes.

In one implementation, the control circuit includes a first diode, a second diode and a third diode. Anodes of the first diode, the second diode and the third diode are connected to the RF signal input interface. A cathode of the first diode is connected to the local coil signal output interface. A cathode of the second diode is connected to the body coil signal output interface. A cathode of the third diode is connected to the dummy load.

In one implementation, the control circuit includes a first diode, a second diode and a third diode. The anode of the first diode is connected to the RF signal input interface and the local coil signal output interface. The cathode of the first diode is grounded. The anode of the second diode is connected to the RF signal input interface. The cathode of the second diode is connected to the body coil signal output interface. The anode of the third diode is connected to the RF signal input interface and the dummy load. The cathode of the third diode is grounded. A phase difference of an odd number of multiples of a quarter wavelength is present between the RF signal input interface and the anode of the first diode. A phase difference of an odd number of multiples of a quarter wavelength is present between the RF signal input interface and the anode of the third diode. A phase difference of an odd number of multiples of a quarter wavelength is present between the dummy load and the anode of the third diode.

In one implementation, a respective inductor is disposed between the RF signal input interface and the anode of the first diode, between the RF signal input interface and the anode of the third diode, and between the dummy load and the anode of the third diode, such that, in each case, a phase difference of an odd number of multiples of a quarter wavelength is present therebetween.

In one implementation, the transmit antenna selector further includes a body coil signal input interface. When the RF signal input interface is electrically connected with the body coil signal output interface, the control circuit electrically connects the body coil signal input interface with the dummy load in accordance with a control signal and via the diodes.

In one implementation, the control circuit includes a first diode, a second diode, a third diode and a fourth diode. The anodes of the first diode, the second diode and the third diode are connected to the RF signal input interface. The cathode of the first diode is connected to the local coil signal output interface. The cathode of the second diode is connected to the body coil signal output interface. The cathode of the third diode is connected to the dummy load and an anode of the fourth diode. A cathode of the fourth diode is connected to the body coil signal input interface.

In one implementation, the control circuit includes a first diode, a second diode, a third diode and a fourth diode. The anode of the first diode is connected to the RF signal input interface and the local coil signal output interface. The cathode of the first diode is grounded. The anode of the second diode is connected to the RF signal input interface. The cathode of the second diode is connected to the body coil signal output interface. The anode of the third diode is connected to the RF signal input interface, the dummy load and the anode of the fourth diode. The cathode of the third diode is grounded. The cathode of the fourth diode is connected to the body coil signal input interface. A phase difference of an odd number of multiples of a quarter wavelength is present between the RF signal input interface and the anode of the first diode. A phase difference of an odd number of multiples of a quarter wavelength is present between the RF signal input interface and the anode of the third diode. A phase difference of an odd number of multiples of a quarter wavelength is present between the dummy load and the anode of the third diode. A phase difference of an odd number of multiples of a quarter wavelength is present between the anode of the fourth diode and the anode of the third diode.

In one implementation, a respective inductor is disposed between the anode of the first diode and the RF signal input interface, and between the dummy load and the anode of the fourth diode, such that, in each case, there is a phase difference of an odd number of multiples of a quarter wavelength therebetween.

In one implementation, the control circuit further includes a plurality of protection circuits respectively connected in parallel to the plurality of diodes, and a plurality of power supplies respectively connected in series to the plurality of diodes. Each protection circuit includes a capacitor and an inductor connected to the capacitor in series. The power supplies are operative to control activation (e.g., ON or OFF) of the diodes.

A magnetic resonance imaging system may include any one of the transmit antenna selectors described above.

The transmit antenna selectors of the present embodiments may be stable in performance, low in cost and suitable for long-term use.

DETAILED DESCRIPTION

A transmit antenna selector includes a control circuit, a body coil signal output interface, a local coil signal output interface, an RF signal input interface, and a dummy load. The control circuit includes a plurality of diodes, and the control circuit electrically connects, according to a control signal and via the diodes, the RF signal input interface with the body coil signal output interface, with the local coil signal output interface, or with the dummy load. Use of a diode to replace a mechanical switch may effectively prolong the service life of the product, enhance the stability performance of the product, and reduce the manufacturing costs of the product.

The transmit antenna selector may also include a dummy load directed to implementing a test and calibration cycle on running services. In some embodiments, the transmit antenna selector may include a 15 KW (Peak Envelope Power (PEP)) 50Ω dummy load so as to block the 90° mix between the signals of a body coil channel selector (BCCS) and a radio frequency power amplifier (RFPA).

Figure 1:
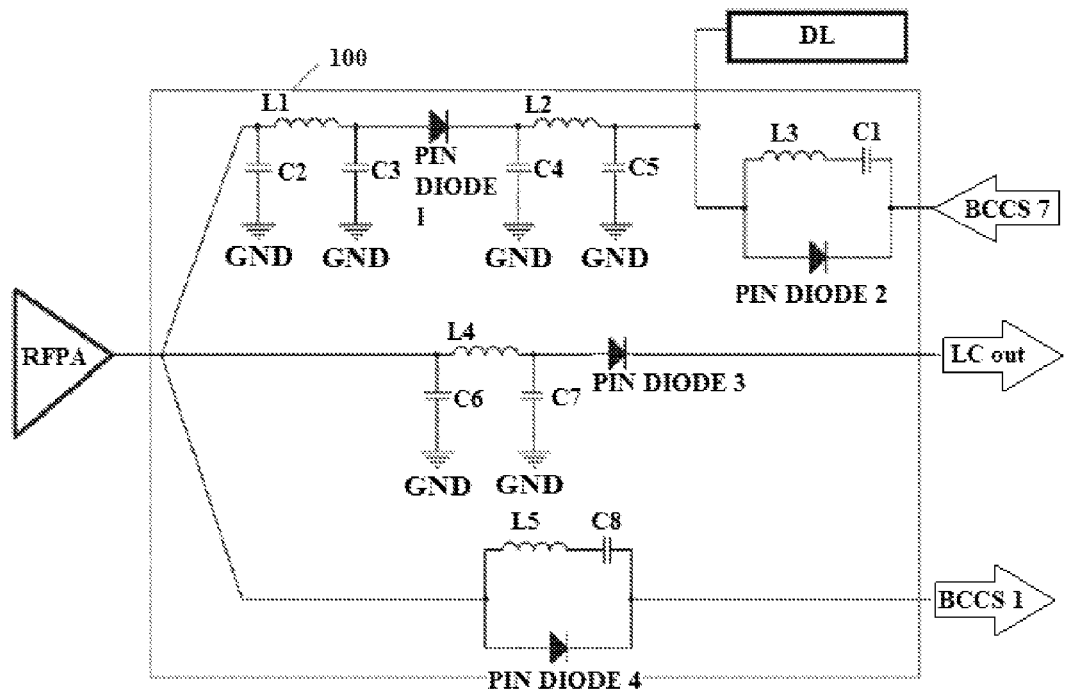
FIG. 1 is a schematic circuit diagram of a transmit antenna selector in accordance with one embodiment.

FIG. 1 is a schematic circuit diagram of a transmit antenna selector according to one embodiment. As shown in FIG. 1, the transmit antenna selector includes a control circuit 100, a body coil signal output interface BCCS_1, a local coil signal output interface LC_Out, an RF signal input interface RFPA, and a dummy load DL. The control circuit includes a plurality of diodes. The control circuit electrically connects, according to a control signal and via the diodes, the RF signal input interface RFPA with the body coil signal output interface BCCS_1, with the local coil signal output interface LC_Out, or with the dummy load DL.

As shown in FIG. 1, the control circuit 100 of the transmit antenna selector includes a first diode PIN DIODE 3, a second diode PIN DIODE 4 and a third diode PIN DIODE 1. An anode of the first diode PIN DIODE 3 is connected to the RF signal input interface RFPA and the local coil signal output interface LC_Out. A cathode of the first diode PIN DIODE 3 is grounded. A cathode of the second diode PIN DIODE 4 is connected to the body coil signal output interface BCCS_1. An anode of the third diode PIN DIODE 1 is connected to the RF signal input interface and the dummy load. A cathode of the third diode PIN DIODE 1 is grounded. In this case, there is a phase difference of an odd number of multiples of a quarter wavelength between the RF signal input interface RFPA and the anode of the first diode PIN DIODE 3. There is a phase difference of an odd number of multiples of a quarter wavelength between the RF signal input interface RFPA and the anode of the third diode PIN DIODE 1. There is a phase difference of an odd number of multiples of a quarter wavelength between the dummy load DL and the anode of the third diode PIN DIODE 1. The phase difference of an odd number of multiples of a quarter wavelength may be realized by the inductor between the RF signal input interface and the anode of the first diode. A number of other ways to realize the phase difference of an odd number of multiples of a quarter wavelength may be used.

The transmit antenna selector further includes a body coil signal input interface BCCS_7. The control circuit 100 switches, according to a control signal and via the diodes, the electrical connectivity of the body coil signal input interface BCCS_7 and the RF signal input interface RFPA with the dummy load DL. At the same time, the control circuit 100 cuts off the connections between the RF signal input interface RFPA and the body coil signal output interface BCCS_1 and the local coil signal output interface LC_Out.

The control circuit 100 thus further includes a fourth diode PIN DIODE 2. The anode of the third diode PIN DIODE 1 is connected to the RF signal input interface RFPA, the dummy load DL and an anode of the fourth diode PIN DIODE 2. The cathode of the third diode PIN DIODE 1 is grounded. A cathode of the fourth diode PIN DIODE 2 is connected to the body coil signal input interface BCCS_7. There is a phase difference of an odd number of multiples of a quarter wavelength between the RF signal input interface RFPA and the anode of the first diode PIN DIODE 3. There is a phase difference of an odd number of multiples of a quarter wavelength between the RF signal input interface RFPA and the anode of the third diode PIN DIODE 1. There is a phase difference of an odd number of multiples of a quarter wavelength between the dummy load DL and the anode of the third diode PIN DIODE 1. There is a phase difference of an odd number of multiples of a quarter wavelength between the anode of the fourth diode PIN DIODE 2 and the anode of the third diode PIN DIODE 1. Each phase difference of an odd number of multiples of a quarter wavelength may be realized by a respective inductor between the anode of the third diode PIN DIODE 1 and the RF signal input interface RFPA, and a respective inductor between the dummy load DL and the anode of the fourth diode PIN DIODE 2. A number of other ways to realize the phase difference of an odd number of multiples of a quarter wavelength may be used. The resistance value of the dummy load DL is 50 ohm.

Figure 2:
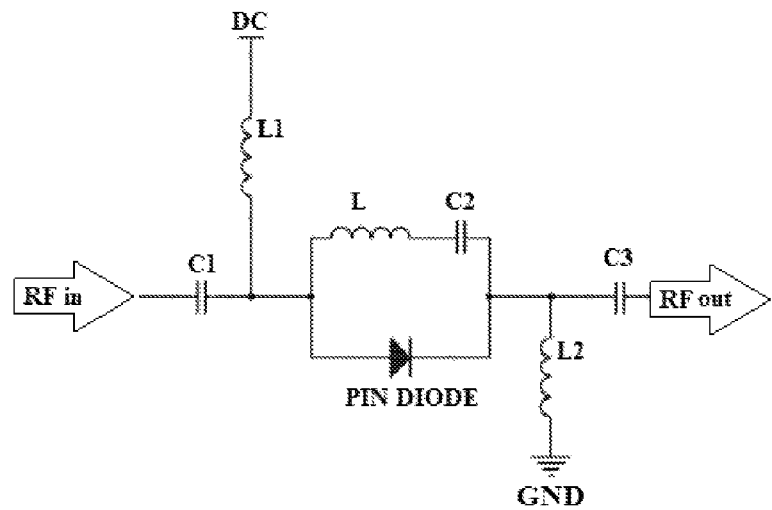
FIG. 2 is a circuit diagram of a diode of the transmit antenna selector of FIG. 1 in accordance with one embodiment.

FIG. 2 is a circuit diagram of a diode of a transmit antenna selector according to one embodiment. The diode may be provided in a power supply and a protection circuit of the transmit antenna selector. As shown in FIG. 2, the control circuit further includes a plurality of protection circuits respectively connected in parallel to the plurality of diodes, and a plurality of power supplies respectively connected in series to the plurality of diodes. Each protection circuit includes a capacitor and an inductor connected thereto in series. The power supplies are used to control activation (e.g., ON or OFF) of the diodes. The first diode PIN DIODE 3, the second diode PIN DIODE 4, the third diode PIN DIODE 1, and the fourth diode PIN DIODE 2 as well as the power supplies and protection circuits thereof, include a diode PIN Diode, a direct current power supply DC connected in series to the diode PIN Diode, and a protection circuit connected in parallel to the diode PIN Diode. The forward bias and the reverse bias of the diode are controlled through the direct current power supply DC. The protection circuit includes a capacitor L and an inductor C connected in series. When the direct current power supply DC provides a 200 mA current, the diode is under forward bias. When the direct current power supply DC provides a −800 V voltage, the diode is under reverse bias.

There is a phase difference of an odd number of multiples of a quarter wavelength between the RF signal input interface RFPA and the anode of the first diode PIN DIODE 3. The phase difference leads to the RF signal input interface RFPA and the anode of the first diode PIN DIODE 3 being reversely orthogonal. For example, when the first diode PIN DIODE 3 is ON for an alternating current signal, the alternating current signal is OFF between the RF signal input interface RFPA and the local coil signal output interface LC_Out, and vice versa.

There is a phase difference of an odd number of multiples of a quarter wavelength between the anode of the third diode PIN DIODE 1 and the RF signal input interface RFPA, and between the dummy load DL and the anode of the fourth diode PIN DIODE 2. The phase differences lead to the anode of the third diode PIN DIODE 1 and the RF signal input interface RFPA, and the dummy load DL and the anode of the fourth diode PIN DIODE 2, being reversely orthogonal. For example, when the anode of the third diode PIN DIODE 1 is ON for an alternating current signal, the alternating current signal is OFF between the RF signal input interface RFPA and the anode of the third diode PIN DIODE 1, and vice versa.

In operation, the transmit antenna selector of the magnetic resonance imaging system includes three working states. Examples of the three working states in accordance with one embodiment are shown in FIG. 1.

A first state is a body coil working state. In this state, diodes PIN DIODE 1, PIN DIODE 2, PIN DIODE 3 and PIN DIODE 4 are under forward bias via a 200 mA current. As a result, a signal from the RF signal input interface RFPA is transmitted through the body coil signal output interface BCCS_1 to the body coil. Meanwhile, BCCS_7 is connected to the 50 Ohm dummy load.

A second state is a local coil working state. In this state, diodes PIN DIODE 2, PIN DIODE 3 and PIN DIODE 4 have a reverse bias voltage of −800 Volts, and diode PIN DIODE 1 has a forward bias current of 200 milliAmps (mA). As a result, a signal from the RF signal input interface RFPA is transmitted to the local coil signal output interface LC_Out.

A third state is a test working state. In this state, diodes PIN DIODE 1 and PIN DIODE 4 have a reverse bias voltage of −800 Volts, and diodes PIN DIODE 2 and PIN DIODE 3 have a forward bias current of 200 mA. Thus, diodes PIN DIODE 1 and PIN DIODE 4 are off, and diodes PIN DIODE 2 and PIN DIODE 3 are on. As a result, a signal from the RF signal input interface RFPA is transmitted to the 50 Ohm dummy load but is not transmitted to the body coil through the body coil signal output interface BCCS_1.

A control circuit of the transmit antenna selector according to another embodiment may be constructed via a connection of the diodes. For example, the control circuit may include a first diode, a second diode, a third diode and a fourth diode, in which the anodes of the first diode, the second diode and the third diode are connected to the RF signal input interface. The cathode of the first diode is connected to the local coil signal output interface. The cathode of the second diode is connected to the body coil signal output interface. The cathode of the third diode is connected to the dummy load and the anode of the fourth diode. The cathode of the fourth diode is connected to the body coil signal input interface.

The control circuit of the transmit antenna selector according to this embodiment may also achieve the technical solution described herein, but the reverse bias voltage used by the control circuit of the transmit antenna selector is as high as 800 Volts. As a result, the stability is high, and the voltage is not be disrupted in circumstances involving complex signals.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:
1. A transmit antenna selector comprising:
a control circuit;
a body coil signal output interface;
a local coil signal output interface;
a radio-frequency signal input interface; and
a dummy load;
wherein the control circuit comprises a plurality of diodes,
wherein the control circuit electrically connects the radio-frequency signal input interface with the body coil signal output interface, with the local coil signal output interface, or with the dummy load, according to a control signal and via the plurality of diodes,
wherein the plurality of diodes comprises a first diode, a second diode and a third diode;
wherein anodes of the first diode, the second diode and the third diode are connected to the radio-frequency signal input interface;
wherein a cathode of the first diode is connected to the local coil signal output interface;
wherein a cathode of the second diode is connected to the body coil signal output interface; and
wherein a cathode of the third diode is connected to the dummy load.
2. The transmit antenna selector of claim 1, further comprising:
a body coil signal input interface, wherein, when the radio-frequency signal input interface is electrically connected with the body coil signal output interface, the control circuit electrically connects the body coil signal input interface with the dummy load in accordance with a control signal and via the plurality of diodes.
3. The transmit antenna selector of claim 2, wherein:
the plurality of diodes further comprises a fourth diode; and
a cathode of the fourth diode is connected to the body coil signal input interface.
4. The transmit antenna selector of claim 3, further comprising:
a first inductor between the anode of the first diode and the radio-frequency signal input interface to effect the phase difference therebetween; and
a second inductor between the dummy load and an anode of the fourth diode to effect the phase difference therebetween.
5. The transmit antenna selector of claim 1, wherein the control circuit further comprises:
a plurality of protection circuits, each protection circuit of the plurality of protection circuits being connected in parallel to a respective diode of the plurality of diodes;
wherein each protection circuit of the plurality of protection circuits comprises a capacitor and an inductor connected to the capacitor in series.
6. A transmit antenna selector comprising:
a control circuit;
a body coil signal output interface;
a local coil signal output interface;
a radio-frequency signal input interface; and
a dummy load;
wherein the control circuit comprises a plurality of diodes,
wherein the control circuit electrically connects the radio-frequency signal input interface with the body coil signal output interface, with the local coil signal output interface, or with the dummy load, according to a control signal and via the plurality of diodes,
wherein the plurality of diodes comprises a first diode, a second diode and a third diode;
wherein an anode of the first diode is connected to the radio-frequency signal input interface;
wherein an anode of the second diode is connected to the radio-frequency signal input interface;
wherein a cathode of the second diode is connected to the body coil signal output interface;
wherein an anode of the third diode is connected to the radio-frequency signal input interface;
wherein a phase difference of an odd number of multiples of a quarter wavelength is present between the radio-frequency signal input interface and the anode of the first diode; and
wherein a phase difference of an odd number of multiples of a quarter wavelength is present between the radio-frequency signal input interface and the anode of the third diode.
7. The transmit antenna selector of claim 6, further comprising:
a first inductor between the radio-frequency signal input interface and the anode of the first diode to effect the phase difference therebetween; and
a second inductor between the radio-frequency signal input interface and the anode of the third diode to effect the phase difference therebetween.
8. The transmit antenna selector of claim 6, further comprising:
a body coil signal input interface, wherein, when the radio-frequency signal input interface is electrically connected with the body coil signal output interface, the control circuit electrically connects the body coil signal input interface with the dummy load in accordance with a control signal and via the plurality of diodes.
9. The transmit antenna selector of claim 6, wherein the control circuit further comprises:
a plurality of protection circuits, each protection circuit of the plurality of protection circuits being connected in parallel to a respective diode of the plurality of diodes;
wherein each protection circuit of the plurality of protection circuits comprises a capacitor and an inductor connected to the capacitor in series.
10. A magnetic resonance imaging system comprising:
a transmit antenna selector comprising:
a control circuit;
a body coil signal output interface;
a local coil signal output interface;
a radio-frequency signal input interface; and
a dummy load;
wherein the control circuit comprises a plurality of diodes,
wherein the control circuit electrically connects the radio-frequency signal input interface with the body coil signal output interface, with the local coil signal output interface, or with the dummy load, according to a control signal and via the plurality of diodes,
wherein the plurality of diodes comprises a first diode, a second diode and a third diode;
anodes of the first diode, the second diode and the third diode are connected to the radio-frequency signal input interface;
a cathode of the first diode is connected to the local coil signal output interface;

a cathode of the second diode is connected to the body coil signal output interface; and a cathode of the third diode is connected to the dummy load.

11. The magnetic resonance imaging system of claim 10, wherein the transmit antenna selector further comprises a body coil signal input interface, wherein, when the radio-frequency signal input interface is electrically connected with the body coil signal output interface, the control circuit electrically connects the body coil signal input interface with the dummy load in accordance with a control signal and via the plurality of diodes.

12. The magnetic resonance imaging system of claim 11, wherein:
   the plurality of diodes further comprises a fourth diode; and
   a cathode of the fourth diode is connected to the body coil signal input interface.

13. The magnetic resonance imaging system of claim 12, wherein the transmit antenna selector further comprises:
   a first inductor between the anode of the first diode and the radio-frequency signal input interface to effect the phase difference therebetween; and
   a second inductor between the dummy load and an anode of the fourth diode to effect the phase difference therebetween.

14. The magnetic resonance imaging system of claim 10, wherein the control circuit further comprises:
   a plurality of protection circuits, each protection circuit of the plurality of protection circuits being connected in parallel to a respective diode of the plurality of diodes;
   wherein each protection circuit of the plurality of protection circuits comprises a capacitor and an inductor connected to the capacitor in series.

15. A magnetic resonance imaging system comprising:
   a transmit antenna selector comprising:
      a control circuit;
      a body coil signal output interface;
      a local coil signal output interface;
      a radio-frequency signal input interface; and
      a dummy load;
   wherein the control circuit comprises a plurality of diodes,
   wherein the control circuit electrically connects the radio-frequency signal input interface with the body coil signal output interface, with the local coil signal output interface, or with the dummy load, according to a control signal and via the plurality of diodes,
   wherein the plurality of diodes comprises a first diode, a second diode and a third diode;
   wherein an anode of the first diode is connected to the radio-frequency signal input interface;
   wherein an anode of the second diode is connected to the radio-frequency signal input interface;
   wherein a cathode of the second diode is connected to the body coil signal output interface;
   wherein an anode of the third diode is connected to the radio-frequency signal input interface;
   wherein a phase difference of an odd number of multiples of a quarter wavelength is present between the radio-frequency signal input interface and the anode of the first diode; and
   wherein a phase difference of an odd number of multiples of a quarter wavelength is present between the radio-frequency signal input interface and the anode of the third diode.

16. The magnetic resonance imaging system of claim 15, wherein the transmit antenna selector further comprises:
   a first inductor between the radio-frequency signal input interface and the anode of the first diode to effect the phase difference therebetween; and
   a second inductor between the radio-frequency signal input interface and the anode of the third diode to effect the phase difference therebetween.

17. The magnetic resonance imaging system of claim 15, wherein the transmit antenna selector further comprises a body coil signal input interface, wherein, when the radio-frequency signal input interface is electrically connected with the body coil signal output interface, the control circuit electrically connects the body coil signal input interface with the dummy load in accordance with a control signal and via the plurality of diodes.

* * * * *